US008242846B2

(12) United States Patent
Kim et al.

(10) Patent No.: US 8,242,846 B2
(45) Date of Patent: Aug. 14, 2012

(54) POWER AMPLIFIER

(75) Inventors: Ki Joong Kim, Gyunggi-do (KR); Youn Suk Kim, Gyunggi-do (KR); Young Jean Song, Gyunggi-do (KR); Jae Hyouck Choi, Gyunggi-do (KR); Jun Goo Won, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 13/012,295

(22) Filed: Jan. 24, 2011

(65) Prior Publication Data

US 2011/0187458 A1 Aug. 4, 2011

(30) Foreign Application Priority Data

Feb. 3, 2010 (KR) ........................ 10-2010-0009989

(51) Int. Cl.
*H03F 3/68* (2006.01)

(52) U.S. Cl. .................................... 330/295; 330/124 R

(58) Field of Classification Search .............. 330/124 R, 330/295, 84, 126
See application file for complete search history.

(56) References Cited

U.S. PATENT DOCUMENTS 5,017,888 A * 5/1991 Meinzer ........................ 330/295
5,543,752 A * 8/1996 Tsukahara ................ 330/124 R
6,181,796 B1 * 1/2001 Johnson .......................... 381/28
7,279,971 B2 * 10/2007 Hellberg et al. .......... 330/124 R
7,649,412 B2 * 1/2010 Horiguchi et al. ........ 330/124 R
7,786,797 B2 * 8/2010 Okazaki et al. ........... 330/124 R
7,876,160 B2 * 1/2011 Zhang et al. .................. 330/295
7,907,009 B2 * 3/2011 Mori et al. ................ 330/124 R
8,085,067 B1 * 12/2011 Stiff ................................ 327/51

FOREIGN PATENT DOCUMENTS

KR 1020040095401 A 11/2004
KR 1020090082969 A 8/2009

OTHER PUBLICATIONS

KIPO Office Action for KR1020100009989, issued Apr. 20, 2011.

* cited by examiner

*Primary Examiner* — Henry Choe

(74) *Attorney, Agent, or Firm* — Lowe, Hauptman, Ham & Berner, LLP

(57) ABSTRACT

There is provided a power amplifier capable of improving harmonics characteristics of an output signal of an amplifier circuit by compensating a phase of the output signal. A power amplifier according to an aspect of the invention may include: an amplification section having a plurality of amplification units each amplifying a radio frequency (RF) signal according to a gain being controlled; a phase correction section performing phase correction by removing harmonic components of respective output signals from the plurality of amplification units of the amplification section; and a coupling section coupling the respective output signals phase-corrected by the phase correction section.

12 Claims, 4 Drawing Sheets

100
110
120
121
Ba
130
140
111
RF IN +
RF IN −
P1
122
122N-1
PN
S
11N
122N
$C_1$
$L_1$
$L_2$
$C_2$
$L_3$
Pout
$C_3$
$L_4$
$L_5$

POWER AMPLIFIER

CROSS-REFERENCE TO RELATED APPLICATIONS

This application claims the priority of Korean Patent Application No. 10-2010-0009989 filed on Feb. 3, 2010, in the Korean Intellectual Property Office, the disclosure of which is incorporated herein by reference.

BACKGROUND OF THE INVENTION

1. Field of the Invention

The present invention relates to a power amplifier, and more particularly, to a power amplifier capable of improving the harmonics characteristics of an output signal of an amplifier circuit by correcting a phase of the output signal.

2. Description of the Related Art

Electronic devices employing wireless communications circuits have recently come into widespread since those electronic devices allow for ease of use and mobility and easy setup and maintenance.

Typical examples of electronic devices employing wireless communications circuits may include mobile communications terminals and personal digital assistants.

A wireless communications electronic device uses a transmitter circuit in order to transmit a signal including information.

The transmitter circuit necessarily uses a power amplifier that amplifies the power of a signal to be transmitted.

A signal being output from the power amplifier is subjected to impedance matching and is output through an antenna. Here, the power amplifier is required to have harmonics characteristics of at least −10 dBm or less.

Therefore, in order to remove harmonic components from the output signal, a notch filter used to remove harmonics is provided at an output terminal.

That is, as shown in FIG. 1, a power amplifier 10 according to the related art amplifies balance signals and couples the amplified balance signals to thereby output a single signal, and then removes harmonic components from the output signal through a filter in an output terminal.

However, the balance signals amplified by the power amplifier according to the related art are converted into a single signal while being output. Therefore, unbalanced signal amplification may be caused, thereby deteriorating second harmonic characteristics. Thus, there is a need for power amplifiers capable of improving second harmonic characteristics.

SUMMARY OF THE INVENTION

An aspect of the present invention provides a power amplifier capable of improving the harmonics characteristics of an output signal of an amplifier circuit by compensating a phase of the output signal.

According to an aspect of the present invention, there is provided a power amplifier comprising: an amplification section having a plurality of amplification units each amplifying a radio frequency (RF) signal according to a gain being controlled; a phase correction section performing phase correction by removing harmonic components of respective output signals from the plurality of amplification units of the amplification section; and a coupling section coupling the respective output signals phase-corrected by the phase correction section.

The power amplifier may further include a filter section removing harmonic components of the output signals coupled by the coupling section.

Each of the plurality of amplification units may comprise at least two cascode amplification devices.

The phase correction section may include a plurality of capacitors electrically connected between respective output terminals of the plurality of amplification units and a ground and bypassing harmonic components of the output terminals from the plurality of amplification units on the ground.

The coupling section may include a transformer including: a plurality of primary windings respectively corresponding to the plurality of amplification units of the amplification section and receiving output signals; and a secondary winding electromagnetically coupled with the plurality of primary windings and coupling signals and coupling the output signals being input to the plurality of primary windings.

The filter section may include a notch filter removing second harmonic components of an output signal from the coupling section and matching an impedance of an output path of the output signal from the coupling section.

Each of the plurality of amplification units of the amplification section may include first and second cascode amplification devices, the first cascode amplification device may be electrically connected between one end of a corresponding primary winding among the plurality of primary windings of the coupling section and the ground, the second cascode amplification device may be electrically connected between the other end of the corresponding primary winding and the ground, and the first cascode amplification device and the second cascode amplification device may be connected in common to each other and have a variable gain, according to a control signal from outside.

The phase correction section may include a plurality of capacitors connected between one end and the other end of each of the plurality of primary windings and the ground and connected in parallel with the first and second cascode amplification devices to remove harmonic components of output signals from the first and second cascode amplification devices.

The RF signal may be a balance RF signal being input to each of the first and second cascode amplification units of each of the plurality of amplification units.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
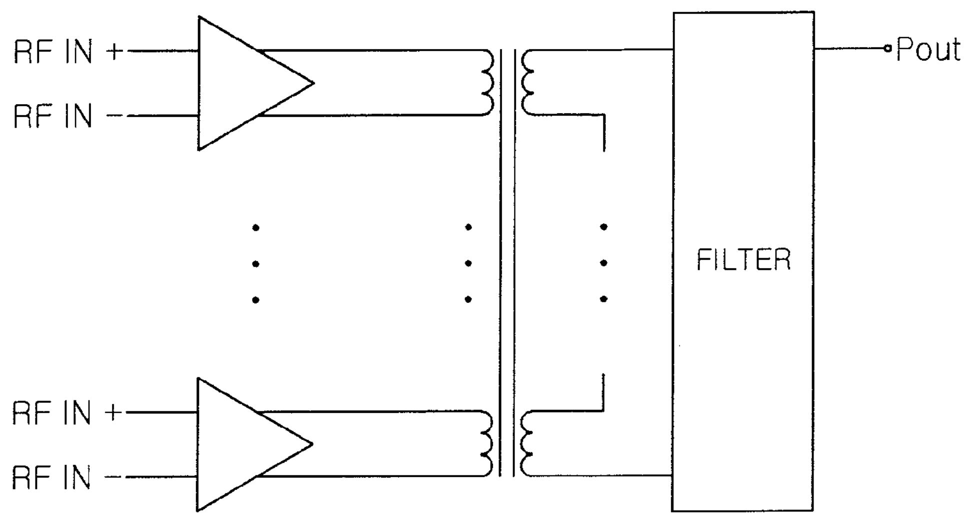
FIG. 1 is a schematic configuration view illustrating a power amplifier according to the related art.
Figure 2:
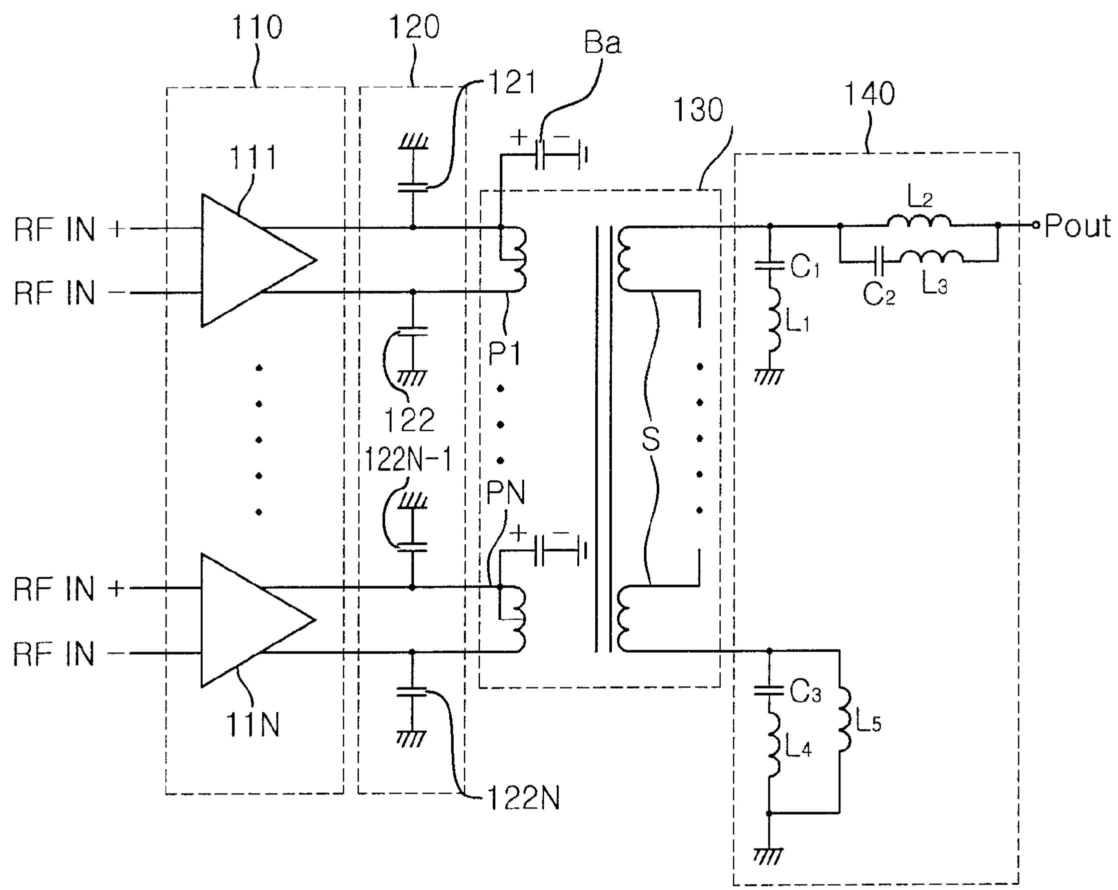
FIG. 2 is a schematic configuration view illustrating a power amplifier according to an exemplary embodiment of the present invention.

FIG. 2 is a schematic configuration view illustrating a power amplifier according to an exemplary embodiment of the invention.

Referring to FIG. 2, a power amplifier 100 according to this embodiment may include an amplification section 110, a phase correction section 120, and a coupling section 130, and may further include a filter section 140.

The amplification section 110 may include a plurality of amplification units 111 to 11N, that is, first to Nth (where N is a natural number) amplification units 111 to 11N.

RF (radio frequency) signals are input to the plurality of amplification units 111 to 11N. Here, the RF signals may be balance RF signals consisting of an RF signal having a positive (+) signal level and an RF signal having a negative (−) signal level.

The plurality of amplification units 111 to 11N may amplify and output the RF signals being input, according to a control signal being externally applied.

The phase correction section 120 may remove harmonic components from respective output signals of the plurality of amplification units 111 to 11N of the amplification section 110 to thereby correct respective phases of the output signals of the plurality of amplification units 111 to 11N.

The phase correction section 120 may include a plurality of capacitors 121 to 122N. The plurality of capacitors 121 to 122N may be respectively electrically connected to corresponding output terminals of the plurality of amplification units 111 to 11N.

For example, when balance RF signals are input to the plurality of amplification units 111 to 11N, the plurality of amplification units 111 to 11N output the balance RF signals being amplified, and the plurality of capacitors 121 to 122N may be respectively electrically connected to the output terminals of the plurality of amplification units 111 to 11N.

Therefore, when the plurality of amplification units 111 to 11N are first to Nth amplification units, the plurality of capacitors 121 to 122N may consist of first to 2Nth capacitors.

That is, one amplification unit that outputs balance RF signals may have two output terminals, and two capacitors may be electrically connected to each of the corresponding output terminals.

The coupling section 130 may include at least one transformer.

The transformer may have a plurality of primary windings P1 to PN and a secondary winding S.

The plurality of primary windings P1 to PN may respectively correspond to the plurality of amplification units 111 to 11N and receive the respective output signals from the plurality of amplification units 111 to 11N.

The secondary winding S may be electromagnetically coupled with the primary windings to thereby couple the power of the output signals that are input to the plurality primary windings P1 to PN.

DC driving power Ba may be supplied to each of the primary windings P1 to PN.

The filter section 140 may remove harmonic components of the signals coupled by the coupling section 130 and match the impedance of an output path of the coupled signals.

For example, the filter section 140 may include a notch filter provided across both ends of the secondary winding S of the coupling section 130, remove harmonic components of the coupled signals, and match the impedance of the output path of the coupled signals.

Therefore, the filter section 140 may include a first filter capacitor C1 and a first inductor L1 that are electrically connected between one end of the secondary winding S and a ground and are connected in series with each other; a second inductor L2 that is connected in series between the one end of the secondary winding S and an output terminal Pout; and a second filter capacitor C2 and a third inductor L3 that are connected in series to each other between the one end of the secondary winding S and the output terminal Pout and are connected in parallel with the second inductor L2.

Furthermore, the filter section 140 may include a third filter capacitor C3 and a fourth inductor L4 that are electrically connected between the other end of the secondary winding S and a ground and are connected in series to each other, and a fifth inductor L5 that is electrically connected between the other end of the secondary winding S and the ground and is connected in parallel with the third filter capacitor C3 and the fourth inductor L4.

Figure 3:
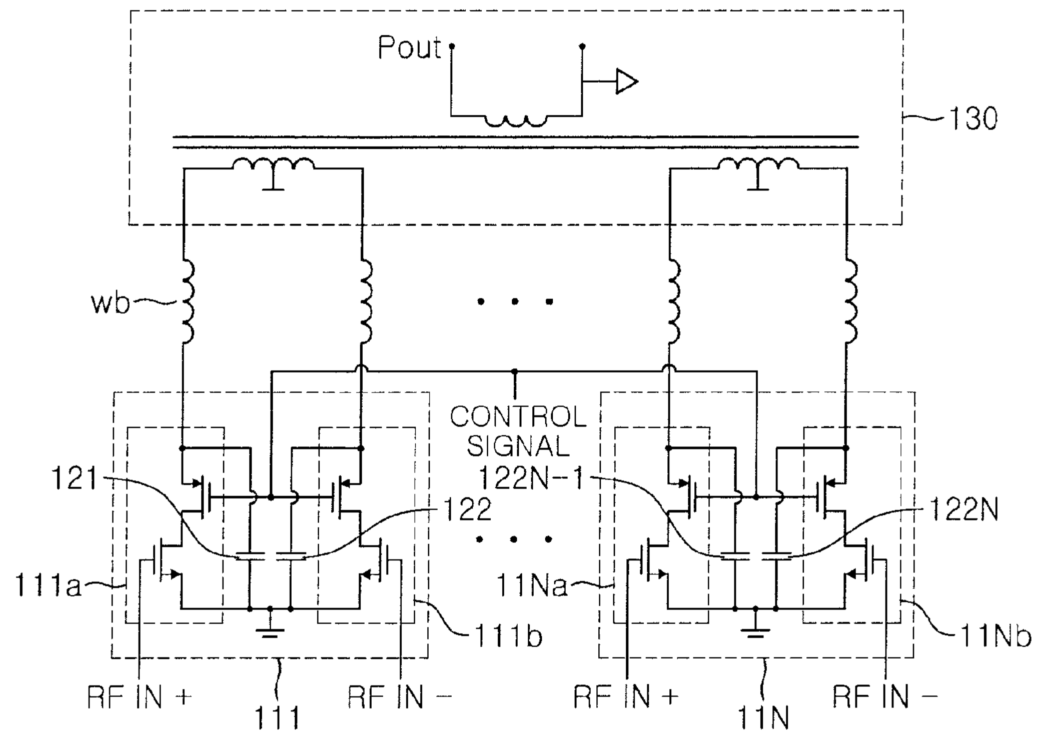
FIG. 3 is a detailed configuration view illustrating an amplification section and a phase correction section that are employed in a power amplifier according to an exemplary embodiment of the present invention.

FIG. 3 is a detailed configuration view illustrating an amplification section and a phase correction section that are employed in a power amplifier according to an exemplary embodiment of the invention.

Referring to FIG. 3 along with FIG. 2, the amplification section 110 used in the power amplifier 100 according to this embodiment may include the plurality of amplification units 111 to 11N, and each of the plurality of amplification units 111 to 11N may include two cascode amplification devices. For example, the first amplification unit 111 may include cascode amplification devices 111*a* and 111*b*, while the Nth amplification unit 11N may include cascode amplification devices 11N*a* and 11N*b*.

For example, the first and second cascode amplification devices 111*a* and 111*b* of the first amplification unit 111 may respectively include PMOS and NMOS amplification devices that are connected in series with each other. An RF signal may be input to a gate of the NMOS amplification device of the first and second cascode amplification devices 111*a* and 111*b*, a source of the NMOS amplification device may be connected to a ground, and a drain of the NMOS amplification device may be connected to the PMOS amplification device. The PMOS amplification device of the first and second cascode amplification devices 111*a* and 111*b* may have a gate connected in common to receive a control signal being externally applied, thereby varying its gain. A drain of the PMOS amplification device may be connected to the NMOS amplification device, and a source of the PMOS amplification device may be connected to one end or the other end of the corresponding primary winding of the coupling section 130. The source of the PMOS amplification device may be connected to the one end or the other end of the corresponding primary winding of the coupling section 130 by wire bonding wb.

A detailed description of the Nth amplification unit 11N and the first and second cascode amplification devices 11N*a* and 11N*b*, which have the same connection as above, will be omitted.

The plurality of capacitors 121 to 122N of the phase correction section 120 may be electrically connected to the corresponding amplification units. That is, as shown in FIG. 3, when an RF signal having a positive level RF IN+ and an RF signal having a negative level RF IN− are input to the first and second cascode amplification devices 111*a* and 111*b*, respectively, the first and second capacitors 121 and 122 are connected in parallel with the first and second cascode amplification devices 111*a* and 111*b*, respectively, to thereby bypass the harmonic components of a signal being output from the source of the PMOS amplification device, thereby removing harmonic components.

Figure 4:
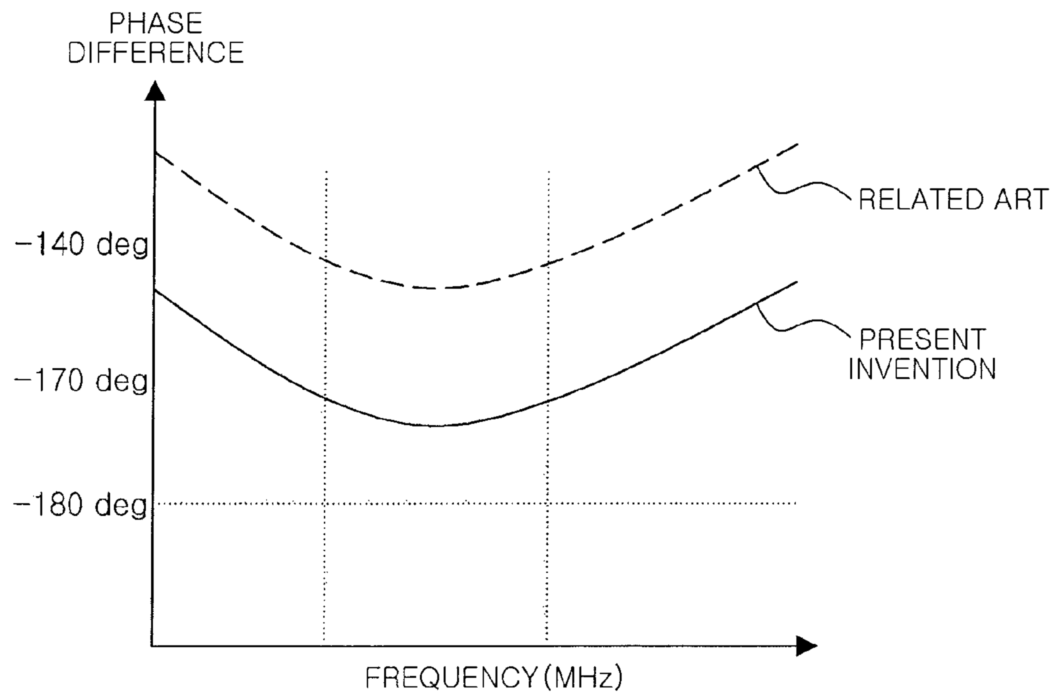
FIG. 4 is a graph illustrating technical effects produced by a phase correction section employed in a power amplifier according to an exemplary embodiment of the present invention.

FIG. 4 is a graph illustrating technical effects produced by a phase correction section that is used in a power amplifier according to an exemplary embodiment of the invention.

Referring to FIG. 4, the phase correction section 120 that is used in the power amplifier according to this embodiment bypasses harmonic components of a signal being output from the source of the PMOS amplification device by the plurality of capacitors 121 to 122N, connected to first and second cascode amplification devices of the amplification units, on the ground to thereby remove harmonic components. Therefore, as compared with a power amplifier according to the related art, an output signal of the power amplifier according to an exemplary embodiment of the invention has an improved phase difference by −30 degrees.

Figure 5A:
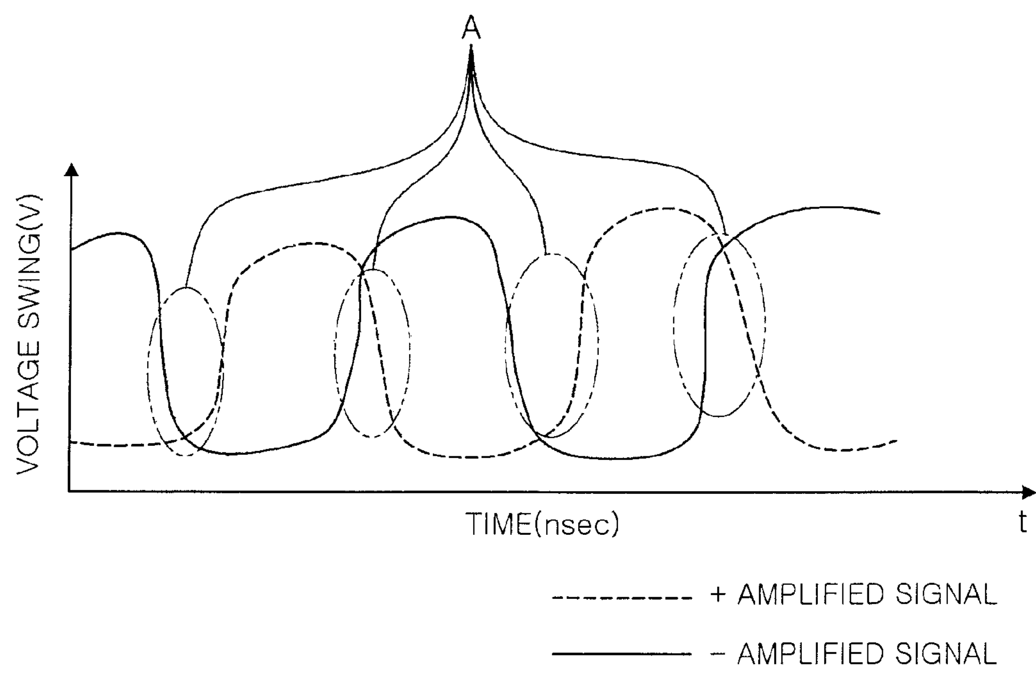
FIGS. 5A and 5B are graphs respectively illustrating output signals of a power amplifier according to the related art and a power amplifier according to an exemplary embodiment of the present invention.
Figure 5B:
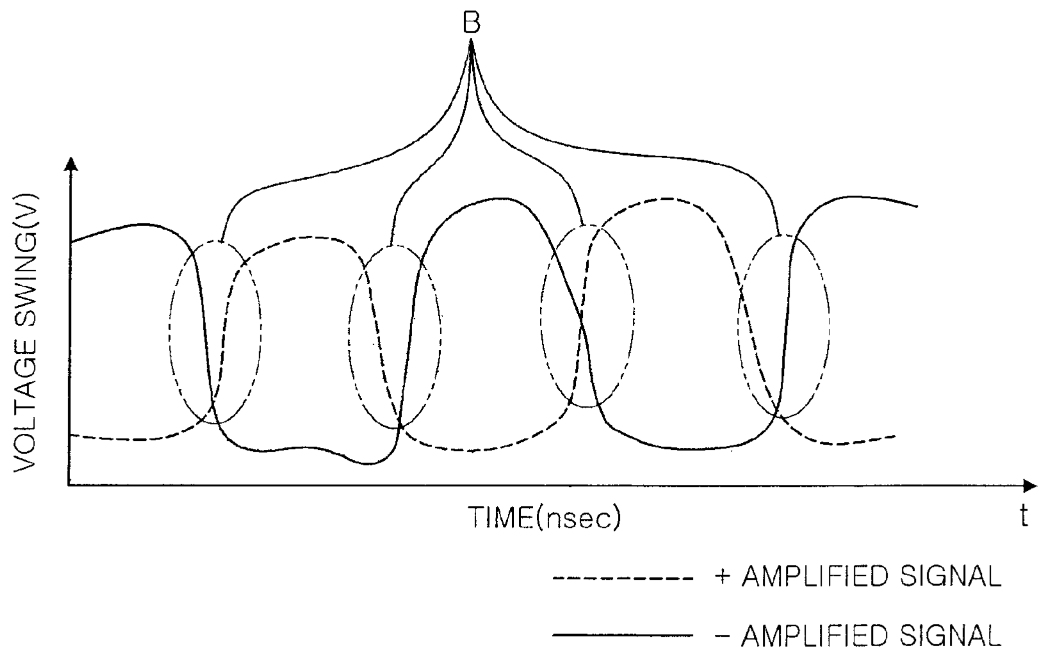

FIG. 5A is a graph illustrating an output signal of a power amplifier according to the related art. FIG. 5B is a graph illustrating an output signal of a power amplifier according to an exemplary embodiment of the invention.

Referring to FIG. 5A, as for output signals of a power amplifier according to the related art, since a phase difference of −180 degrees does not occur between an output signal having a positive level and an output signal having a negative level, unbalanced signal amplification is obtained as illustrated by reference character A.

On the other hand, as shown in FIG. 5B, harmonic components of output signals from an amplification unit are bypassed on the ground to thereby correct a phase difference, so that as for output signals from a power amplifier according to an exemplary embodiment of the invention, a phase difference of approximately −180 degrees occurs between an output signal having a positive level and an output signal having a negative level. As a result, balanced signal amplification is performed as illustrated by reference character B.

Figure 6A:
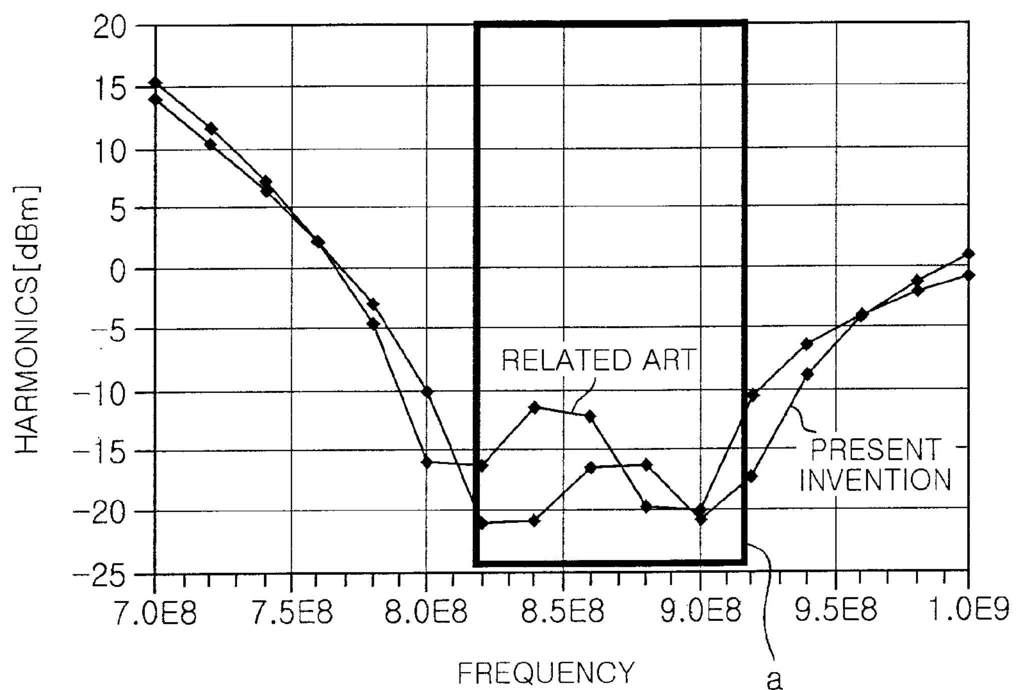
FIGS. 6A and 6B are graphs illustrating signal characteristics of a power amplifier according to an exemplary embodiment of the present invention.
Figure 6B:
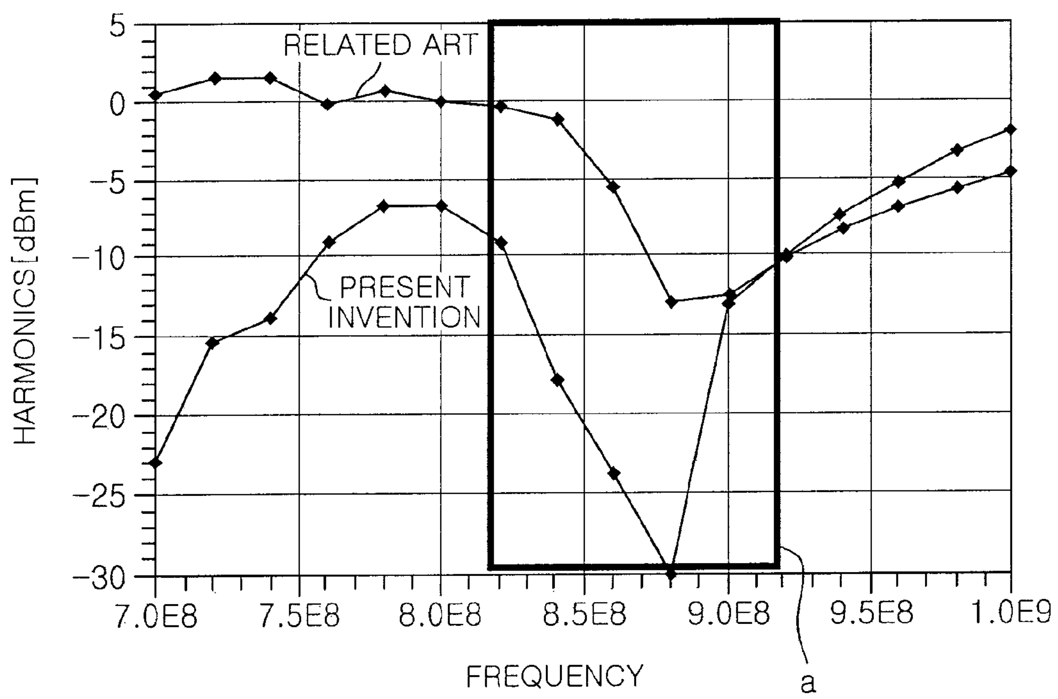

FIGS. 6A and 6B are graphs illustrating signal characteristics of a power amplifier according to an exemplary embodiment of the invention.

Referring to FIGS. 6A and 6B along with FIGS. 2 and 3, a comparison in signal characteristics between a power amplifier according to an exemplary embodiment of the invention and a power amplifier according to the related art is shown.

Referring to FIG. 6A, a frequency bandwidth of an RF signal that is being used is indicated by square box. As shown in FIG. 6A, in a frequency bandwidth of an RF signal to be used, as compared with the power amplifier according to the related art, the power amplifier according to an exemplary embodiment of the invention has third harmonic components being slightly reduced (refer to reference character “a”).

Furthermore, with reference to FIG. 6B, as compared with the power amplifier according to the related art, in a frequency bandwidth of an RF signal to be used, the power amplifier according to the exemplary embodiment of the invention has significantly reduced second harmonic components. The second harmonic components are significantly reduced to −5 dBm or less required by a user (refer to reference character “a”).

As described above, according to the embodiment of the invention, harmonic components are first removed before signal coupling by correcting phases of output signals from an amplification unit, and harmonic components are then removed after signal coupling, so that a reduction of harmonic components to −5 dBm or less required by a user can be achieved, and a balanced phase difference between output signals can be maintained.

As set forth above, according to exemplary embodiments of the invention, DC components of output signals are removed from an amplifier circuit through capacitors to thereby correct phases of the output signals of the amplifier circuit, so that second harmonic characteristics of the output signals can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A power amplifier, comprising:
an amplification section having a plurality of amplification units each for amplifying a radio frequency (RF) signal according to a controllable gain;
a phase correction section for performing phase correction by removing harmonic components of respective output signals from the plurality of amplification units of the amplification section; and
a coupling section for coupling the respective output signals phase-corrected by the phase correction section, wherein
the coupling section comprises a transformer including:
a plurality of primary windings respectively corresponding to the plurality of amplification units of the amplification section for receiving the respective output signals; and
a secondary winding electromagnetically coupled with the plurality of primary windings for coupling the output signals being input to the plurality of primary windings.

2. A power amplifier, comprising:
an amplification section having a plurality of amplification units each for amplifying a radio frequency (RF) signal according to a controllable gain;
a phase correction section for performing phase correction by removing harmonic components of respective output signals from the plurality of amplification units of the amplification section;
a coupling section for coupling the respective output signals phase-corrected by the phase correction section; and
a filter section for removing harmonic components of the output signals coupled by the coupling section, wherein
the filter section comprises a notch filter for removing second harmonic components of an output signal from the coupling section and matching an impedance of an output path of the output signal from the coupling section.

3. The power amplifier of claim 1, wherein
each of the plurality of amplification units of the amplification section comprises first and second cascode amplification devices,
the first cascode amplification device is electrically connected between one end of a corresponding primary winding among the plurality of primary windings of the coupling section and the ground,
the second cascode amplification device is electrically connected between the other end of the corresponding primary winding and the ground, and the first cascode amplification device and the second cascode amplification device are connected in common to each other and have a variable gain, according to a control signal from outside.

4. The power amplifier of claim 3, wherein the phase correction section comprises a plurality of capacitors connected between one end and the other end of each of the plurality of primary windings and the ground and connected in parallel with the first and second cascode amplification devices to remove harmonic components of output signals from the first and second cascode amplification devices.

5. A power amplifier, comprising:

an amplification section having a plurality of amplification units each for amplifying a radio frequency (RF) signal according to a controllable gain;

a phase correction section for performing phase correction by removing harmonic components of respective output signals from the plurality of amplification units of the amplification section;

a coupling section for coupling the respective output signals phase-corrected by the phase correction section; and a filter section for removing harmonic components of the output signals coupled by the coupling section, wherein the RF signal is a balance RF signal being input to each of first and second cascode amplification devices of each of the plurality of amplification units.

6. The power amplifier of claim 1, further comprising a filter section for removing harmonic components of the output signals coupled by the coupling section.

7. The power amplifier of claim 1, wherein each of the plurality of amplification units comprises at least two cascode amplification devices.

8. The power amplifier of claim 1, wherein the phase correction section comprises a plurality of capacitors electrically connected between respective output terminals of the plurality of amplification units and a ground for bypassing harmonic components of the output signals from the output terminals of the plurality of amplification units to the ground.

9. The power amplifier of claim 2, wherein each of the plurality of amplification units comprises at least two cascode amplification devices.

10. The power amplifier of claim 2, wherein the phase correction section comprises a plurality of capacitors electrically connected between respective output terminals of the plurality of amplification units and a ground for bypassing harmonic components of the output signals from the output terminals of the plurality of amplification units to the ground.

11. The power amplifier of claim 5, wherein each of the plurality of amplification units comprises at least two cascode amplification devices.

12. The power amplifier of claim 5, wherein the phase correction section comprises a plurality of capacitors electrically connected between respective output terminals of the plurality of amplification units and a ground for bypassing harmonic components of the output signals from the output terminals of the plurality of amplification units to the ground.

* * * * *